United States Patent [19]

Matsumoto et al.

[11] Patent Number: 5,406,027
[45] Date of Patent: Apr. 11, 1995

[54] MOUNTING STRUCTURE AND ELECTRONIC DEVICE EMPLOYING THE SAME

[75] Inventors: Kunio Matsumoto, Yokohama; Kazuo Hirota, Chigasaki; Munehisa Kishimoto, Kamakura, all of Japan

[73] Assignee: Hitachi, Ltd., Tokyo, Japan

[21] Appl. No.: 796,680

[22] Filed: Nov. 25, 1991

[30] Foreign Application Priority Data

Nov. 26, 1990 [JP] Japan ................... 2-317758

[51] Int. Cl.6 .......................................... H01L 23/28
[52] U.S. Cl. ....................... 174/52.2; 361/736; 361/749; 174/260; 257/687; 257/787
[58] Field of Search ............. 174/52.2, 250, 260, 174/261; 361/397, 398, 412, 414, 736, 737, 739, 748, 749, 750–751; 257/685, 687, 787

[56] References Cited

U.S. PATENT DOCUMENTS

| | | | |
|---|---|---|---|
| 3,039,177 | 6/1962 | Burdett | 361/749 |
| 4,296,457 | 10/1981 | Hahlganss | 361/749 |
| 4,364,619 | 12/1982 | Inayat-Khan | 361/749 |
| 4,639,830 | 1/1987 | Fukuoka | 174/52.2 |
| 4,781,601 | 11/1988 | Kuhl et al. | 361/749 |
| 5,161,009 | 11/1992 | Tanoi et al. | 361/749 |

FOREIGN PATENT DOCUMENTS 61-268417 11/1986 Japan .

OTHER PUBLICATIONS

Nikkei Electronics, "Diversification of Mounting Boards", Aug. 1988, No. 454, pp. 125–144.

*Primary Examiner*—Bot Ledynh
*Attorney, Agent, or Firm*—Antonelli, Terry, Stout & Kraus

[57] ABSTRACT

The present invention relates to a mounting structure adapted to be mainly used commercially and to an electronic device employing such mounting structure. A board carrying a plurality of chips is directly coated with resin to form a casing or a part thereof. Alternatively a plurality of the boards interconnected by flexible wiring sheets and coated with resin with retaining the flexibility of the wiring sheets. Such structure helps to provide a handy electric device which is required to be compact, light-weight and thin.

10 Claims, 5 Drawing Sheets

MOUNTING STRUCTURE AND ELECTRONIC DEVICE EMPLOYING THE SAME

FIELD OF THE INVENTION AND RELATED ART STATEMENT

The present invention relates to a mounting structure adapted to be mainly used commercially and to an electronic device employing the same.

Recently, an important issue in commercial electronic devices is reduction of size, weight and thickness thereof. To meet this issue, various mounting techniques have already been developed. One of them is a hybrid technique of a plurality of mounting functions as described in "Diversification of Mounting Boards" in Nikkei Electronics issued on Aug. 22, 1988 (No. 454) pp. 125 to 144. Particularly, circuit boards supplemented with a casing function, a heat-radiating function and an electromagnetic shielding function have been developed so as to facilitate the production of compact, light-weight and thin electronic devices.

For example, in a magnetic disk drive, there are reported a chassis provided thereon with an electric circuit and an electromagnetic circuit of a motor an aluminum metal core board having heat radiation and electromagnetic shield functions, and a resin casing into which an electric circuit board is molded which has a casing function and serves as a circuit board. The metal core boards are very useful in this hybrid mounting technique because a metal core board can be used as a heat-radiator, an electromagnetic shield, a casing, a structural frame, and an electric circuit.

Although the connection among the components is usually performed by a surface-connection utilizing soldering, it is reported that the connection is performed by a chip mounting to solve the above-mentioned issue.

As described above, a hybrid technique of a plurality of functions has been employed to reduce size, weight and thickness of electronic devices. However, devices employing the above techniques have the following problems:

(1) There is an unnecessary space inside the devices.
(2) Size reduction is hindered in devices having folding means because the folding means and flexible wiring are separately constructed in such devices.
(3) Size reduction is hindered because the mounted chips are separately covered or coated by resin.
(4) Simplifying the mounting process is hindered because the connection of the components and molding of the casing are required to performed separately.

OBJECT AND SUMMARY OF THE INVENTION

It is an object of the present invention to provide a mounting structure which eliminates factors causing the above problems, as well as retains advantages of the conventional art, so as to facilitate producing an electronic device with a reduced size, weight and thickness, and at low cost.

In order to achieve the above object, in the mounting structure according to the present invention, the following means are employed.

A board carrying a plurality of chips is directly coated with resin to form a casing or a part of a casing of an electric device, responding to the above problems (1), (3) and (4), and a plurality of boards are interconnected by flexible wiring sheets and then coated by resin in such a manner that the flexibility of the wiring sheets is maintained, responding to the above problem (2).

A metal core board is employed, when necessary, which is suitably deformed to make top portions of the chips mounted on the board level, to provide necessary strength for a casing or to temporarily connect the flexible wiring sheets and the components to the board.

Since a board carrying chips is directly coated by resin, a process in which each of the chips is separately coated by resin is eliminated, thus solving the problem (3). Also, since the board and the resin form a hybrid structure, a necessary strength thereof is obtained. Further, the structure is made into a casing and all the chips mounted on the board are entirely enclosed with the resin, thereby an unnecessary space inside a device is eliminated. Thus the problem (1) is solved. Since the shrinking force of a curing resin is utilized to press the chips to connect them to the board, the connecting process such as soldering is simplified. Thus the problem (4) is solved.

Since boards interconnected by flexible wiring sheets are coated by resin so that flexibility of the wiring sheets is maintained, the flexible wiring sheets can be employed as the folding mechanism. Thus the problem (2) is solved.

When a metal core board is used, a plastic deformation thereof can reduce the size, weight and thickness of the device. Namely, the metal core board is deformed to level down the tops of the mounted chips so as to reduce the unnecessary space. Thus the problem (1) is solved. The deformed board provides the necessary strength for the hybrid structure, it helps to produce thinner electronic devices. A portion of the board may be used as a caulking means, thereby a connection of the components and the flexible wiring sheets to the board is simplified. Thus the problem (4) is solved.

The above mounting means can be served as a heat-radiator, an electromagnetic shield and a magnetic circuit.

DETAILED DESCRIPTION OF THE PREFERRED EMBODIMENTS

Figure 1A:
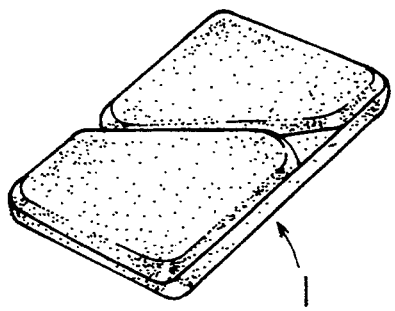
FIGS. 1A, 1B, 2 and 3 are perspective views showing electronic devices employing a mounting structure according to the present invention.
Figure 1B:
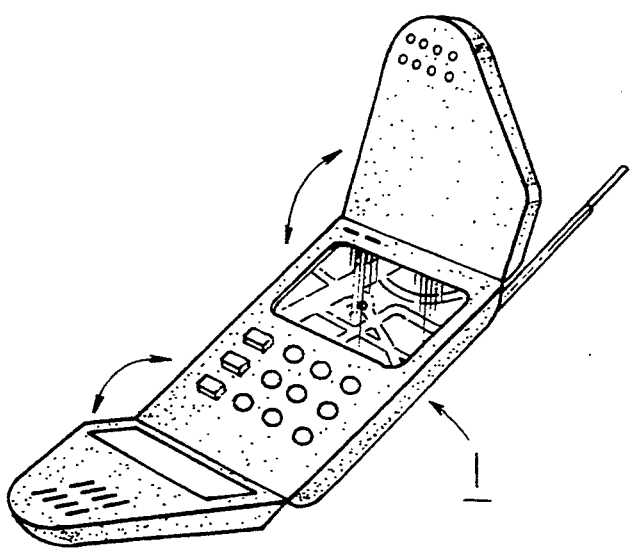

FIG. 1A illustrates a portable wireless telephone 1 which can also be used as a very small terminal. This portable wireless telephone 1 has a folding mechanism by which it can be folded to the size of a credit-card for portage. The wireless telephone 1 is expanded to be used as a telephone handset, as shown by in FIG. 1B.

Figure 2:
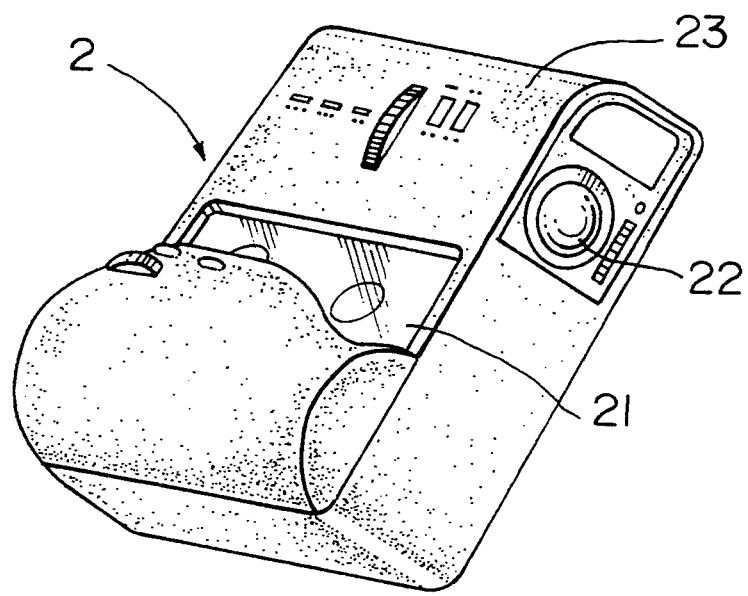

FIG. 2 illustrates a small-size video camera 2. The mounting structure according to the present invention is applied to a tape loading and unloading means 21, a lens system 22 and the housing 23 of the video camera 2 so as to contain electronic components therein. Therefore, this video camera 2 can be made compact and light-weight without reducing its mechanical strength.

Figure 3:
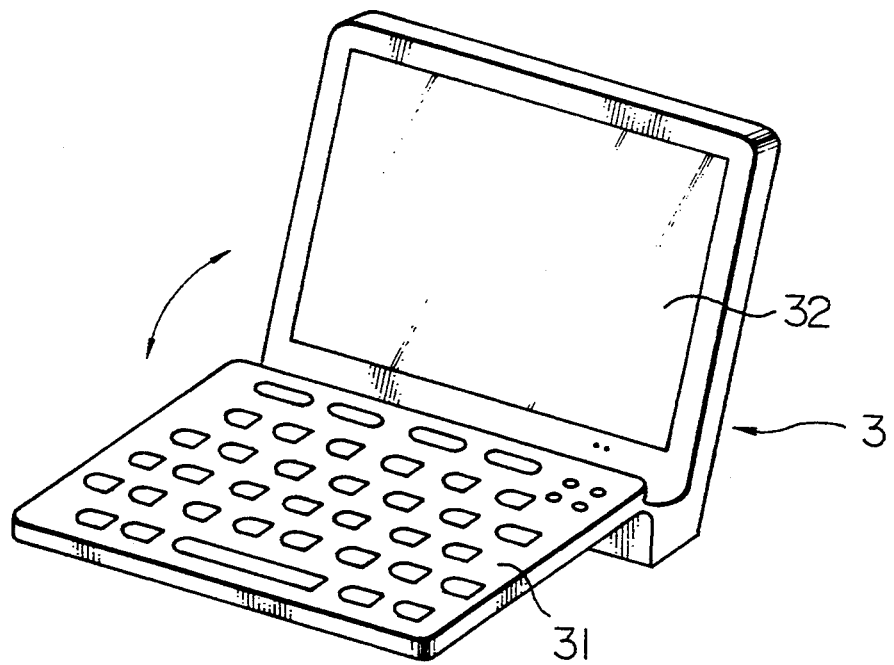

FIG. 3 shows a small-size personal computer 3. The computer 3 can be folded when it is to be carried and is expanded to expose a key board 31 and a display 32 when it is to be used, in a similar manner to that described in the above-mentioned portable wireless telephone. These electronic devices shown in FIGS. 1A, 2 and 3 are examples of devices employing mounting structure according to the present invention. The mounting structure according to the present invention may be applicable to any other electronic device, such as electronic clocks, calculators, radios, TVs, audio cassette devices, compact disk drives, word-processors and work-stations.

Figure 4:
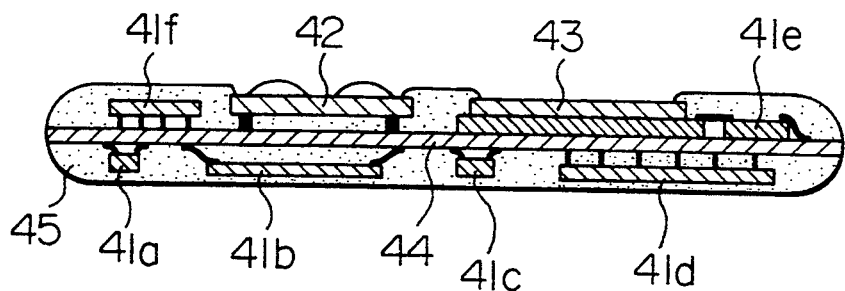
FIG. 4 is a sectional view showing a mounting structure according to one embodiment of the present invention.

FIG. 4 illustrates a mounting structure according to another embodiment of the present invention.

Chips 41a–41f, such as a chip capacitor, a chip resistor, a semiconductor chip and a chip coil, a switching device 42 and a display element 43 of liquid crystal are connected to a board 44 by a soldering, thermal pressure bonding or wire bonding so that they are integrated into an electronic circuit. The board 44 is covered or coated with resin 45 except for surfaces of the switching device 42 and the display element 43. Thus coated board 44, i.e. the mounting structure, is used as a whole or a part of an electronic device. When the chips 41a–41f include a connector (not shown), contact terminals thereof are not covered with resin 45.

As naturally understood from the construction of the mounting structure shown in FIG. 4, a hybrid structure of the board 44 and the resin 45 provides sufficient strength for the frame of the electronic device though it is very thin. In the conventional art, each semiconductor chip is previously sealed by resin and then connected to a board and thus occupies a substantially large area or volume. However, in this mounting structure, semiconductor chips are directly mounted on the board B. Therefore, the body size of an electronic device can be further reduced. Further, a shrinking force caused by curing of the resin 45 enhances the connections of the chips 41a–41f, the switching device 42 and the display element 43 to the board 44. Therefore metallic processes can be omitted, such as a soldering process onto these components.

Figure 1C:
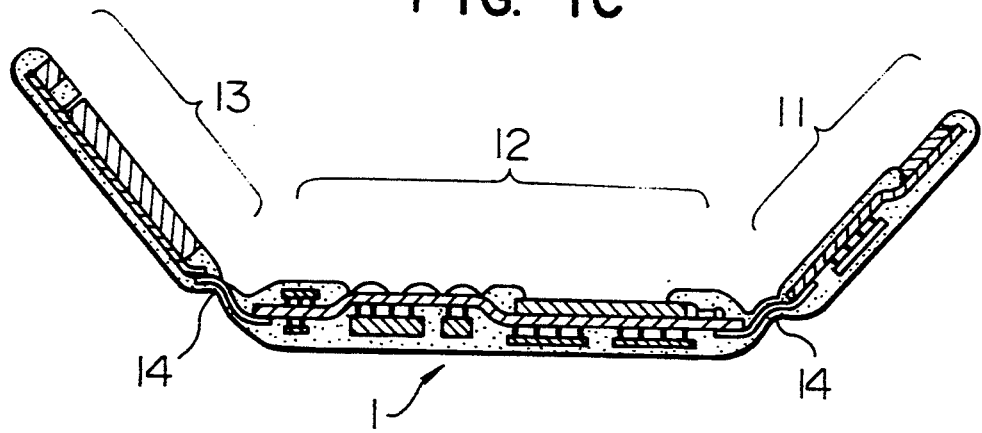
FIGS. 1C to 1F are sectional views showing folding mechanism in the mounting structure according to another embodiment of the present invention.
Figure 1D:
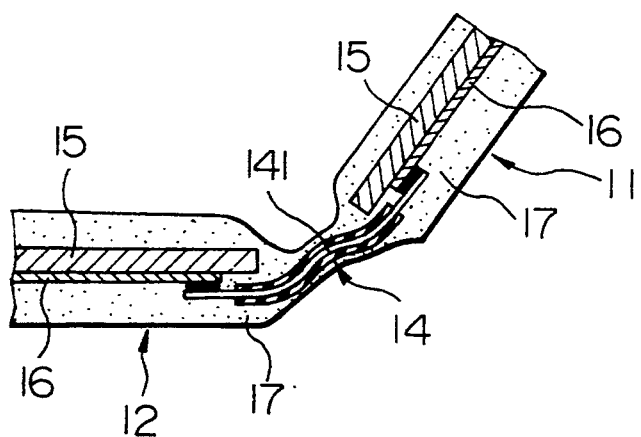
Figure 1E:
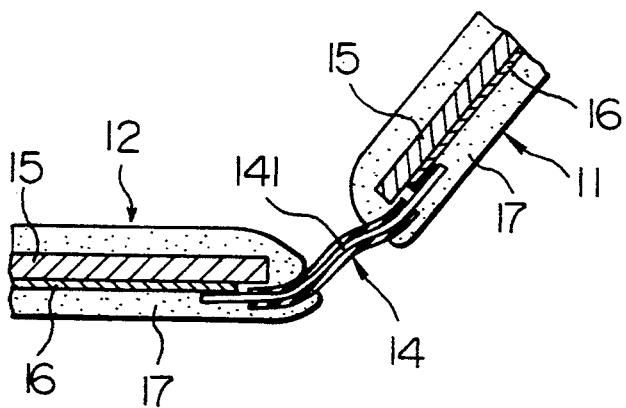

Referring to FIGS. 1C–1E, the portable telephone 1 comprises a receiver unit 11, a main body unit 12 and a speaker unit 13. They are connected by two folding mechanisms and by flexible wiring sheets 14. As shown in FIG. 1D, wiring portions of the sheets 14 are insulated, except for portions connected to boards 15. A flexible wire 141 of the sheets 14 is connected, by soldering or caulking as described below, to conductors 16 patterned on the boards 15 of the units 11 and 12. Subsequently, a whole of the boards 15 is covered or coated by resin to form a mounting structure. In order to secure the flexibility of the sheets 14 after resin coating, an elastic resin 17 is used to coat the entire structure including the sheets 14 as shown in FIG. 1D. However, a central portion of the sheet 14 may not be coated by resin 17 as shown in FIG. 1E.

Although the boards 15 used in the above embodiments are made of paper phenol or glass epoxy as usually used in the commercial devices, a metal core board may be used, instead. The metal core board enables processes to be performed thereon, such as plastic deforming after wire-patterning thereon, and thus provides the mounting structure with a new feature. Embodiments of the present invention employing metal core boards will be described below with reference to FIGS. 5–9.

Figure 5:
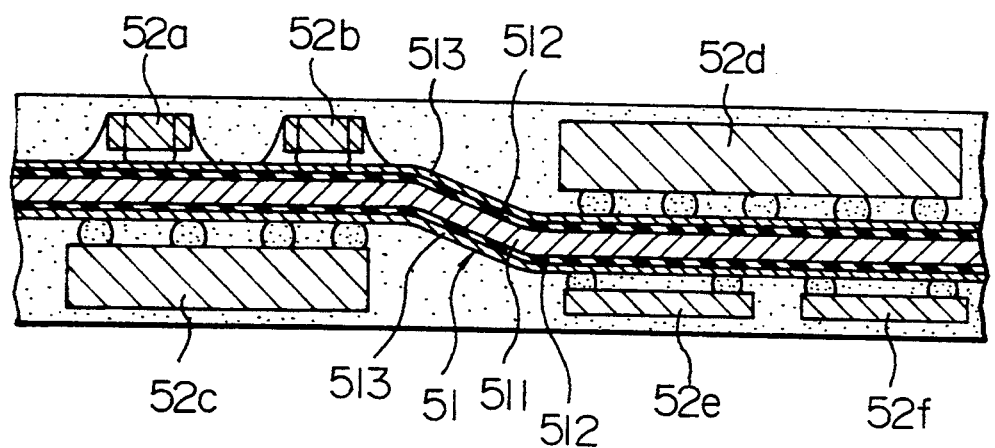
FIGS. 5 to 7 illustrate embodiments of the present invention employing metal core boards.

In an embodiment shown in FIG. 5, a metal core board 51 is plastically deformed so as to level the top portions of chips 52a–52f mounted thereon. The metal core board 51 includes a metal core 511, insulation layers 512 opposite sides of the metal core 511 and conductors 513. The chips 52a–52f are connected to the deformed metal core board 51, for example, by soldering. Then they are coated by resin to form a mounting structure. The mounting structure is incorporated in an electronic device to eliminate unnecessary space inside the device and thus reduce the thickness of the device.

Figure 6:
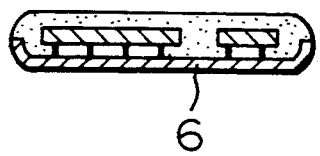
Figure 7:
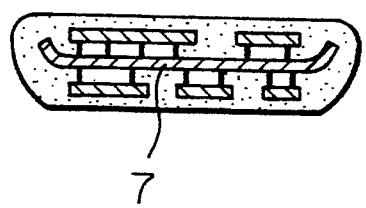

FIGS. 6 and 7 illustrate embodiments in which the metal core boards 6 and 7 are partially deformed or perforated (not shown) to increase the mechanical strength thereof after resin coating. FIG. 6 illustrates an embodiment in which one side of the metal core board 6 is covered by resin. FIG. 7 illustrates an embodiment in which the entire board 7 is coated by resin.

Figure 1F:
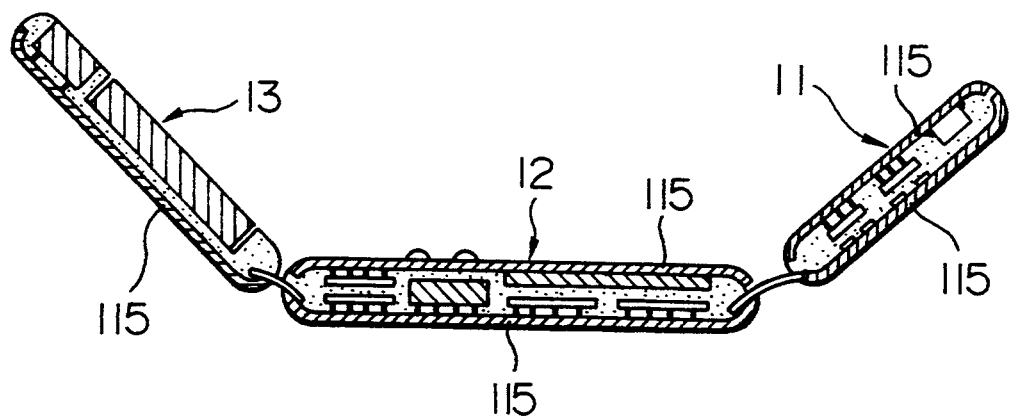

FIG. 1F shows a modification of the portable wireless telephone shown in FIG. 1C. In this embodiment, metal core boards 115 are so disposed that one side of each board 115 forms an exterior surface on one or both sides of an electronic device. Being thus constructed, a mounting structure according to this embodiment provides a sufficient mechanical strength, a favorable heat-radiation, a tight electromagnetic shielding and a wide range of design choices.

Further embodiments of the present invention which is aimed at simplifying connecting processes in the case where metal core boards are employed will be described hereinafter with referring to FIGS. 8A to 8C.

Figure 8A:
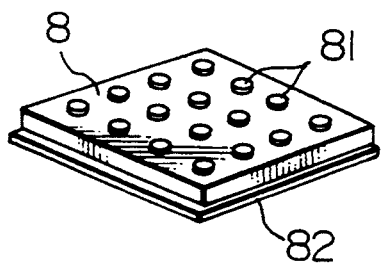
FIGS. 8A to 8C illustrate connection of chips in the mounting structure according to still another embodiment of the present invention.
Figure 8C:
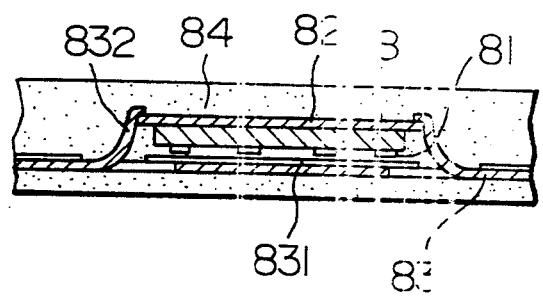
Figure 8B:
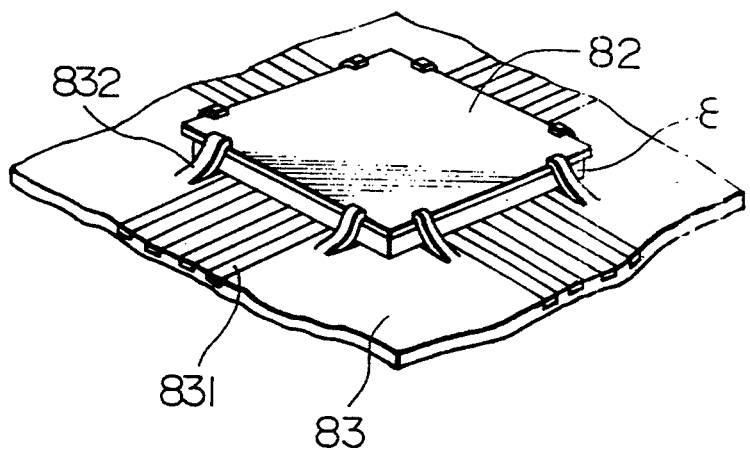

As shown in FIG. 8A, a semiconductor chip 8 is provided at connecting portins on one side thereof with bumps 81 formed of gold of solder. A reinforcing board 82 is bonded on the other side of the semi-conductor chip 8. As shown in FIGS. 8B and 8C, the semiconductor chip 8 is so disposed face-down on a metal core board 83 that the bumps 81 come into contact with conductors 831 patterned on the metal core board 83. For proper contact therebetween, at first the semi-conductor chip 8 is temporarily fixed on the metal core board 83 by caulking stoppers 832 which are welded on the metal core board 83 or cut and bent up from the metal core board 83 (FIG. 8B). Then, after resin-coating, shrinking force caused by the curing of the resin 84 provides sufficient pressure to enhance contact between the bumps 81 and the conductors 831. The reinforcing board 82 may be omitted for connecting a small-size semiconductor chip 8.

Figure 9:
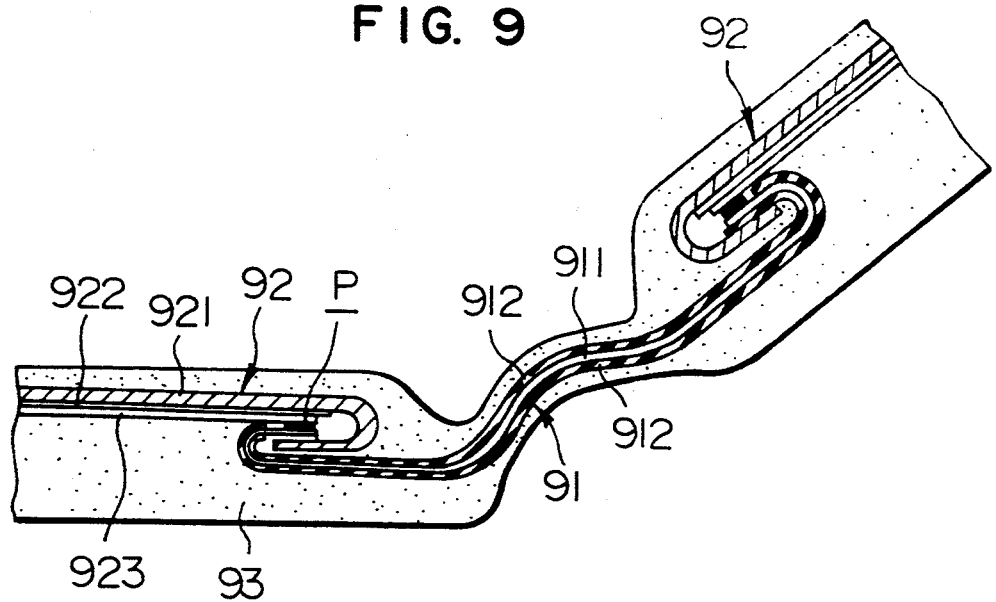
FIG. 9 illustrates connection of a flexible wiring sheet in the mounting structure according to further still another embodiment of the present invention.

FIG. 9 is an enlarged view of a connecting portion between the above-mentioned flexible wiring sheet 91 and the metal core board 92. In the figure, the metal core board 92 which includes a metal core 921, an insulation layer 922 and conductors 923 is plastically deformed at an end of the metal core 921 to enclose an end portion of the flexible wiring sheet 91. Although flexible conductors 911 are almost entirely coated with insulating sheets 912 in the flexible wiring sheet 91, the insulating sheets 912 at the portions connected to the metal core board 92 are removed, so that the above-mentioned deformation electrically connects the conductors 911 to the conductors 923 paterned on the metal core 921 at a point P. Then, the entire assembly is coated with a resin 93, so that the connections are enhanced. In this manner, connections with high reliability are provided, even though the connecting potions are close to the folding portion.

The connection which utilizes the plastic deformability of a metal core is applicable not only to the connection of chips as described above but also to the connection of other electronic components, such as switching devices and display elements.

When this connection is employed for an electronic device, the device can be tested for its functions or reliability after the electronic components are preconnected to the metal core board by caulking namely, before the resin-coating. Replacing a defective component is easy at this stage, if any are found.

For further reducing of weight, an expandable resin may be used as the coating resin. The expandable resin may be applicable to any of the above-described mounting structures.

The present invention provides a hybrid structure wherein chips are mounted in a casing or a shell of an electronic device, namely a Chip-in-Shell Structure. According this, there are provided the following advantages: eliminating unnecessary space inside an electronic device; enabling compact folding means; increasing chip package density; and simplifying the connecting process. Besides, the features already achieved by the conventional art are maintained, according to the present invention, such as shell strength, heat-radiation, electromagnetic shielding, integration with mechanical parts, and reliability.

In short, a mounting structure according to the present invention helps provide a compact and handy electronic device which is required to be compact, lightweight or thin.

What is claimed is:

1. A mounting structure comprising:
   a plurality of chips;
   a plurality of boards carrying said chips;
   a flexible wiring sheet connecting said boards; and
   resin with which said plurality of boards with said chips and at least a portion of said flexible wiring sheet is coated to form a casing or a part thereof, wherein said boards are coated with resin with retaining flexibility of said wiring sheet.

2. A structure according to claim 1, wherein said plurality of boards are metal core boards.

3. A structure according to claim 2, wherein said metal core boards and said flexible wiring sheet are interconnected by caulking said metal core boards.

4. A structure according to claim 1, wherein said resin is an expandable resin.

5. A mounting structure according to claim 1, wherein three boards are provided for carrying said chips, a middle one of said three boards being connected at opposing ends to adjacent end boards by said at least one flexible wiring sheet, and wherein said end boards can be folded onto said middle boards.

6. A mounting structure according to claim 1, wherein said resin is an elastic resin.

7. An electronic device comprising:
   a plurality of boards, each of said boards carrying at least one element selected from the group consisting of a semiconductor chip, a switching device and a display element;
   at least one flexible wiring sheet connecting adjacent ones of said plurality of boards;
   a casing for said electronic device, said casing comprising a resin with which said plurality of boards and said at least one element and at least a portion of said flexible wiring sheet is directly coated to form said casing or a part thereof while retaining flexibility of said at least one wiring sheet.

8. An electronic device according to claim 7, wherein said electronic device is a portable wireless telephone and comprises three boards, a first of said three boards forming a main body, a second of said three boards forming a receiver unit connected to said main body by one of said at least one flexible wiring sheet, and a third of said three boards forming a speaker unit connected to said main body by another of said at least one flexible wiring sheet, wherein said receiver unit and said speaker unit can be folded onto said main body.

9. An electronic device according to claim 7, wherein said resin is an elastic resin.

10. An electronic device according to claim 9, wherein said elastic resin is directly coated on said at least one flexible wiring sheet.

* * * * *